(12) United States Patent
Viehland et al.

(10) Patent No.: US 7,771,846 B2
(45) Date of Patent: Aug. 10, 2010

(54) METHOD AND APPARATUS FOR HIGH-PERMEABILITY MAGNETOSTRICTIVE/PIEZO-FIBER LAMINATES HAVING COLOSSAL, NEAR-IDEAL MAGNETOELECTRICITY

(75) Inventors: Dwight Viehland, Blacksburg, VA (US);
Shuxiang Dong, Blacksburg, VA (US);
Jie-Fang Li, Blacksburg, VA (US);
Junyi Zhai, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 78 days.

(21) Appl. No.: 11/832,564

(22) Filed: Aug. 1, 2007

(65) Prior Publication Data
US 2008/0193780 A1 Aug. 14, 2008

Related U.S. Application Data
(60) Provisional application No. 60/834,557, filed on Aug. 1, 2006.

(51) Int. Cl.
*B32B 15/04* (2006.01)
(52) U.S. Cl. .................................. 428/693.1
(58) Field of Classification Search ......... 428/689, 428/692.1, 693.1, 681, 900, 548, 611, 668, 428/615; 324/200, 244, 249, 109, 151 R; 331/157; 310/311, 357, 358, 328, 26, 331, 310/332
See application file for complete search history.

(56) References Cited

U.S. PATENT DOCUMENTS

| | | | | |
|---|---|---|---|---|
| 4,634,917 | A * | 1/1987 | Dvorsky et al. | 310/328 |
| 6,809,516 | B1 * | 10/2004 | Li et al. | 324/260 |
| 2001/0028245 | A1 * | 10/2001 | Li et al. | 324/312 |
| 2004/0126620 | A1 * | 7/2004 | Viehland et al. | 428/692 |
| 2005/0218729 | A1 * | 10/2005 | Or et al. | 310/26 |

OTHER PUBLICATIONS

Meeks, Steven, and J. Clifton Hill. "Piezomagnetic and elastic properties of metallic glass alloys Fe67CO18B14Si1 and Fe81B13.5Si3.5C2." J. Appl. Phys. vol. 54, No. 11 (1983): 6584-6593.*
Dong et al. "Push-pull mode magnetostrictive/piezoelectric laminate composite with an enhanced magnetoelectric voltage coefficient." Applied Physics Letters 87(2005): 062502-1 to 062502-3.*

\* cited by examiner

*Primary Examiner*—Holly Rickman
*Assistant Examiner*—Lisa Chau
(74) *Attorney, Agent, or Firm*—Whitham Curtis Christofferson & Cook, PC

(57) ABSTRACT

An ME composite laminate of at least one (1-3) piezo-fiber layer coupled with high-permeability alloy magnetostrictive layers, optionally formed of FeBSiC or equivalent. The composite laminate alternates the (1-3) piezo-fiber and high-permeability alloy magnetostrictive layers in a stacked manner. Optionally, the magnetization direction of the high-permeability alloy magnetostrictive layers and polarization direction of the piezo-fiber layer are an (L-L) arrangement. Optionally, thin film polymer layers are between the (1-3) piezo-fiber layer and high-permeability alloy magnetostrictive layers. Optionally, piezo-electric fibers within the (1-3) piezo-fiber layer are poled by inter-digitated electrodes supported by the thin film polymer, arranged as alternating symmetric longitudinally-poled "push-pull" units.

4 Claims, 5 Drawing Sheets

METHOD AND APPARATUS FOR HIGH-PERMEABILITY MAGNETOSTRICTIVE/PIEZO-FIBER LAMINATES HAVING COLOSSAL, NEAR-IDEAL MAGNETOELECTRICITY

CROSS-REFERENCE TO RELATED APPLICATIONS

This application claims priority to U.S. Provisional Application Ser. No. 60/834,557 filed Aug. 1, 2006.

STATEMENT OF GOVERNMENT INTEREST

This invention was made with government support under Grant Number N00014-04-1-0492, awarded by the Office of Naval Research. The Government has certain rights in the invention.

FIELD OF THE INVENTION

The present invention relates generally to structures having coupled piezoelectric and magnetostrictive structures and, more particularly, to laminate composites of magnetostrictive and piezoelectric layers.

BACKGROUND OF THE INVENTION

Magnetoelectricity (ME) is a characteristic of certain materials and composites, defined as a magnetization induced by an applied electric field and the inverse, i.e., an electric polarization induced by an applied magnetic field. Materials and composites exhibiting ME can be employed for various purposes, including detecting magnetic fields. "Sensitivity," the ratio of the change in polarization to the change in magnetic field, is one ME performance metric. One measure of sensitivity is the ME field coefficient, or $\alpha_{me}$, defined as the $\delta E/\delta H$ ratio in volts-per centimeter per Oersted (V/cm-Oe).

ME is exhibited by certain single-phase bulk materials, such as $Cr_2O_3$ and $BiFeO_3$, and certain single-phase epitaxial films. However, the highest published ME measurement, at room temperature, of $Cr_2O_3$ crystals shows a sensitivity of approximately $2.67 \times 10^{-12}$ s/m or, equivalently, $\alpha_{me} = \delta E/\delta H = 0.01$ V/cm-Oe. See, e.g., V. J. Folen, et al., Phys. Rev. Lett. 6, 607-608 (1961). The sensitivity of such single-phase materials, however, is generally too low to be useful for most applications.

ME effects exhibited by certain multiphase arrangements formed of mechanically coupled magnetostrictive and piezoelectric phases are significantly greater. In fact, the ME sensitivity of such composites can be orders of magnitude higher the sensitivity of known single-phase materials. Therefore, because sensitivity is a critical requirement in various devices and applications employing ME, such composites are almost always utilized.

The general principles by which composites of magnetostrictive and piezoelectric phases exhibit ME effects are straightforward. When the composite is placed in a magnetic field, the magnetostrictive phase undergoes dimensional change. This in turn distorts the piezoelectric phase that is mechanically coupled to the magnetostrictive phase. The piezoelectric phase therefore generates a voltage.

There are many known arrangements of such ME composites. One arrangement is a composite laminate, which is a lamination of layers of magnetostrictive and piezoelectric phases, in a generally alternating sequence. One classification scheme for such composite laminates is the Newnham, which is generally in terms of the respective relative directions of the polarization axis of the piezoelectric layer(s), the magnetization axis of the magnetostrictive layer(s), and the axes in which the layers extend. Known types include the (L-P), the (L-T) and the (L-L), which are discussed in greater below.

Existing composite laminates of magnetostrictive and piezoelectric phases employ a steady-state, or "DC" magnetic field, referenced herein as $H_{dc}$ to increase the ME sensitivity of the devices. In prior art ME composite laminates high sensitivity requires a high $H_{dc}$. High $H_{dc}$, though, typically requires high power consumption.

The highest $\alpha_{ME}$ attained in the prior art has been termed "giant" ME field coefficients. Examples of such giant ME coefficients have been reported for (L-T) (longitudinally-magnetized transversely-poled) composites of piezoelectric $Pb(Zr,Ti)O$ (PZT) layers laminated with layers of magnetostrictive $Tb_{1-x}Dy_xFe_{2-y}$ or Terfenol-D ($\alpha_{ME}^{(L-T)}=2$V/cm·Oe), see .S. Dong, J. F. Li and D. Viehland, Appl. Phys. Lett., 83, 2265 (2003), or laminated with Permendur ($\alpha_{ME}^{(L-T)}=0.8$V/cm·Oe), see U. Lestin, et al., Applied Physic A-Materials Science & Processing, 78 (1), 33 (2004); or Fe—Ga ($\alpha_{ME}^{(L-T)}=0.4$V/cm·Oe), see S. Dong, et al., J. Appl. Phys. 97, 10392 (2005); or $NiFe_2O_4$ ($\alpha_{ME}^{(L-T)}=0.45$V/cm·Oe), see G. Srinivasab, et al., Phys. Rev. B 64, 214408 (2001).

Further composite laminates having giant ME coefficients $\alpha_{ME}$ are disclosed by U.S. Pat. No. 7,023,206 (the '206 patent), issued to inventors of the present invention, which is hereby incorporated by reference in its entirety. FIG. 2 of the '206 patent discloses an example L-P configuration and FIG. 5 of the '206 patent discloses example (L-L) configuration. Magnetic sensors according to the '206 patent's (L-P) configuration have shown ME sensitivities of approximately 55 mV/Oe at a bias of about 500 Oe. Magnetic sensors according to the '206 patent's (L-L) configuration have shown sensitivities of approximately 225 mV/Oe, at a bias in the approximate range of 600-800 Oe.

The $\alpha_{ME}^{LL}$ values obtained by the prior art, however, are orders of magnitude lower than the theoretical values, for reasons not known in the prior art.

SUMMARY OF THE INVENTION

The present invention is an ME composite laminate providing a colossal ME coefficient, approaching that of the theoretical limit of ME composite laminates.

Embodiments include (L-L) configurations providing values of $\alpha_{ME}^{L-L}$ approaching the theoretical limit of (L-L) ME composite laminates, providing more than one hundred times the ME coefficient $\alpha_{ME}^{L-L}$ of the known existing (L-L) ME composites, at approximately one hundredth the $H_{dc}$ bias level. These embodiments obtain the near-ideal magnetoelectricity latent in the (L-L) configuration, which prior art (L-L) ME structures have not achieved.

The present invention achieves these and other described benefits with an arrangement of high-permeability magnetostrictive alloy layers coupled to a (1-3) piezo-fiber layer.

Samples embodying the present invention have been constructed and clearly exhibit colossal ME coefficients of $\alpha_{ME}^{(L-L)}$ greater than 20 V/cm-Oe, under biases as small as 5 Oe. This approaches the theoretical limit identified by the present inventors for (L-L) configuration ME composite laminates.

The present inventors identify the theoretical limit of $\alpha_{ME}^{(L-L)}$ in V/cm-Oe, in the case of perfect or ideal ME coupling, as $$\alpha_{ME}^{(L-L)} = \frac{nd_{33,m}g_{33,p}}{ns_{33}^E(1-k_{33}^2)+(1-n)s_{33}^H} \quad \text{(Eq. 1)}$$

where $S_{33}^E$ and $S_{33}^H$ are the elastic compliances for the piezoelectric and magnetostrictive layers; $k_{33}$ the electromechanical coupling coefficient of the piezoelectric layer; $d_{33,m}$ and $g_{33,p}$ the longitudinal piezomagnetic and piezoelectric voltage coefficients; and n a thickness fraction of magnetostrictive layers.

The present inventors identify the (L-L) configuration having a theoretical upper limit to its ME sensitivity $\alpha_{ME}$ higher than any other composite laminate configuration, e.g., (L-T), (P-P) or (L-P).

The present inventors have identified, however, that prior art implementations of the (L-L) configurations have nowhere approached the theoretical limit $\alpha_{ME}^{LL}$ defined by Eq. No. 1.

Referring to Eq. No. 1, $\alpha_{ME}^{L-L}$ is proportional to the piezoelectric-voltage $g_{33,p}$ coefficient, rather than to the piezoelectric constant $d_{33}$.

The present inventors identify that, further to Eq. No. 1, the prior art has attempted lamination of piezo-layers with a (1-3) phase connectivity, rather than a monolithic piezoelectric layer, to magnetostrictive layers. Example include prior art investigations include (1-3) ME composites consisting of PZT-rods in a Terfenol-D matrix, described by C. W. Nan, et al., Appl. Phys. Lett., 87, 012503 (2005).

The present inventors identify these attempts as unsuccessful, as none has obtained anywhere close to the theoretical limit of $\alpha_{ME}^{L-L}$, for reasons that are not known in the prior art. The $\alpha_{Me}^{L-L}$ recorded by Nan et al., was approximately 00.5 V/cm-Oe under a required $H_{dc}$ of 2000 Oe. The (L-L) configuration illustrated at FIG. 5 of the '206 patent shows a $\alpha_{ME}^{L-L}$ value of approximately 0.225 mV/cm-Oe, at a bias in the approximate range of 600-800 Oe. According to the present inventors' investigation this $\alpha_{ME}^{L-L}$ is nowhere near the theoretical maximum defined by Eq. No. 1.

The present invention solves these problems with (L-L) configurations of the prior art, and obtains $\alpha_{ME}^{L-L}$ approaching the ideal value defined by Eq. No. 1. This is more than 100 times the $\alpha_{ME}^{L-L}$ attained in the prior art attempts, and this solving a long-felt need for a very high $\alpha_{ME}^{L-L}$.

DETAILED DESCRIPTION OF ILLUSTRATIVE EMBODIMENTS

Figure 1:
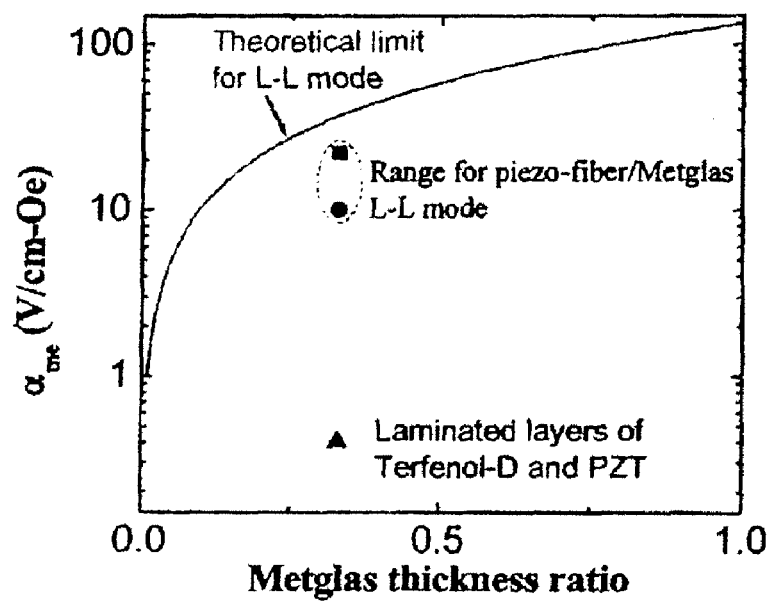
FIG. 1 shows a comparison of a graph plot of a theoretical limitation of $\alpha_{ME}^{(L-L)}$ as a function of thickness fraction (n), calculated using Eq. (1), to values of (L-L) observed in experiments on (L-L) composite ME laminates according to the prior art and to observed $\alpha_{ME}^{(L-L)}$ values of constructed samples according to the FIG. 2 example embodiment.

The following detailed description of the invention is in reference to accompanying drawings, which form a part of this description. The drawings are illustrative examples of various embodiments and combinations of embodiments in which the invention may be practiced. The invention is not limited, however, to the specific examples described herein and/or depicted by the attached drawings. Other configurations and arrangements can, upon reading this description, be readily seen and implemented by persons skilled in the arts.

In the drawings, like numerals appearing in different drawings, either of the same or different embodiments of the invention, reference functional or system blocks that are, or may be, identical or substantially identical between the different drawings.

Various embodiments of the invention, although different, are not necessarily mutually exclusive. For example, a particular feature, function, act or characteristic described in or in relation to one embodiment may, within the scope of the invention, be included in or used with other embodiments. Likewise, various instances of the phrase "in one embodiment" do not necessarily refer to the same embodiment.

Unless otherwise stated or made clear from its context, the terminology and labeling used herein is not limiting and, instead, is only for purposes of consistency in referencing the examples.

The embodiments are described in a detail sufficient for a person of ordinary skill in the art to practice the invention. It is assumed that the person of ordinary skill in art has knowledge of ME theory, conventional ME composite laminate design practices, ME material sciences, known analytical techniques and established fabrication methods for ME composite laminates known in the art. Therefore, except for illustrative examples, the conventional practices, methods and techniques ordinary skill would, upon reading this disclosure, apply in practicing the invention are omitted, or are not described in detail.

Unless otherwise stated or clear from the description, exploded views in the drawings are only for illustrating spatial relation of certain structures, and are not necessarily descriptive of any method order of fabrication steps.

Unless otherwise stated or clear from their context in the description, various instances of the term the terms "top" and "bottom" mean only a relative spacing, in any order, in a direction normal to a "planar" direction, without any meaning or limitation as to geographic or gravitational direction.

Unless otherwise stated or clear from their context in the description, various instances of the terms "disposed on," "arranged on" "laminated arrangement," and "provided on" mean only a spatial relationship of structure(s) and, unless otherwise stated or made clear from the context do not describe or limit any sequential order of fabrication steps, processes, or acts.

General Overview

Embodiments of the present invention include laminates of at least one (1-3) piezo-fiber layer with high-permeability alloy magnetostrictive layers. One illustrative example high-permeability alloy for the magnetostrictive layer is FeBSiC. Embodiments include (L-L) configurations. As described in greater detail below, these (L-L) embodiments provide values of $\alpha_{ME}^{L-L}$ approaching the theoretical limit of (L-L) ME composite laminates, more than one hundred times the ME coefficient $\alpha_{ME}^{L-L}$ of the known existing (L-L) ME composites, at approximately one hundredth the $H_{dc}$ bias level.

Preferably, the arrangement of the laminate alternates, in a stacked manner, (1-3) piezo-fiber and high-permeability alloy magnetostrictive layers.

Preferably, the number of high-permeability alloy magnetostrictive layers exceeds the number of (1-3) piezo-fiber layers by one.

One embodiment comprises an (L-L) ME composite laminate, formed of one (1-3) piezo-fiber layer arranged between two high-permeability magnetostrictive alloy layers.

One example arrangement is one (1-3) piezoelectric PZT-fiber layer between two high permeability magnetostrictive FeBSiC alloy (e.g., Metglas) foils.

One aspect includes a thin-film polymer layer between each (1-3) piezoelectric PZT-fiber layer and each high permeability magnetostrictive FeBSiC alloy (e.g., Metglas) foils. One aspect includes, within at least one of he thin-film polymer layers overlaying a (1-3) piezo-fiber layer, a pattern of alternating symmetric longitudinally-poled "push-pull" units connecting to at least one of the piezoelectric fibers.

The enormous ME coefficient $\alpha_{ME}^{L-L}$ values of ME composite laminates according to these embodiments, at low very biases, is "colossal" magnetoelectricity.

The present inventors observe, without any statement of theoretical conclusion, that the colossal effects provided by these embodiments occur due to the following three effects and phenomena: (i) optimum stress transfer in the (L-L) (2-1) configuration; (ii) the large $d_{33,m}$ and magnetic flux concentration effect of high-permeability FeBSiC alloy layer; and (iii) the high $g_{33,p}$ of the (1-3) piezofiber layer.

The present inventors observe, without any statement of theoretical conclusion, that the prior art ME composite laminates do not adequately provide or attain these effects and phenomena and, therefore, fall orders of magnitude short of the theoretical limit to ME defined by, for example, Eq. No. 1.

Further, certain arrangements according to the present invention provide a colossal ME coefficient that is frequency independent in the quasi-static range.

Further, certain arrangements according to the present invention exhibit a colossal ME coefficient that, at a selected resonant frequency, is even more significantly increased.

Also, arrangements according to the present invention provide a colossal ME coefficient, with a response that is highly anisotropic, offering unidirectional sensitivity.

Illustrative Arrangements

Figure 2:
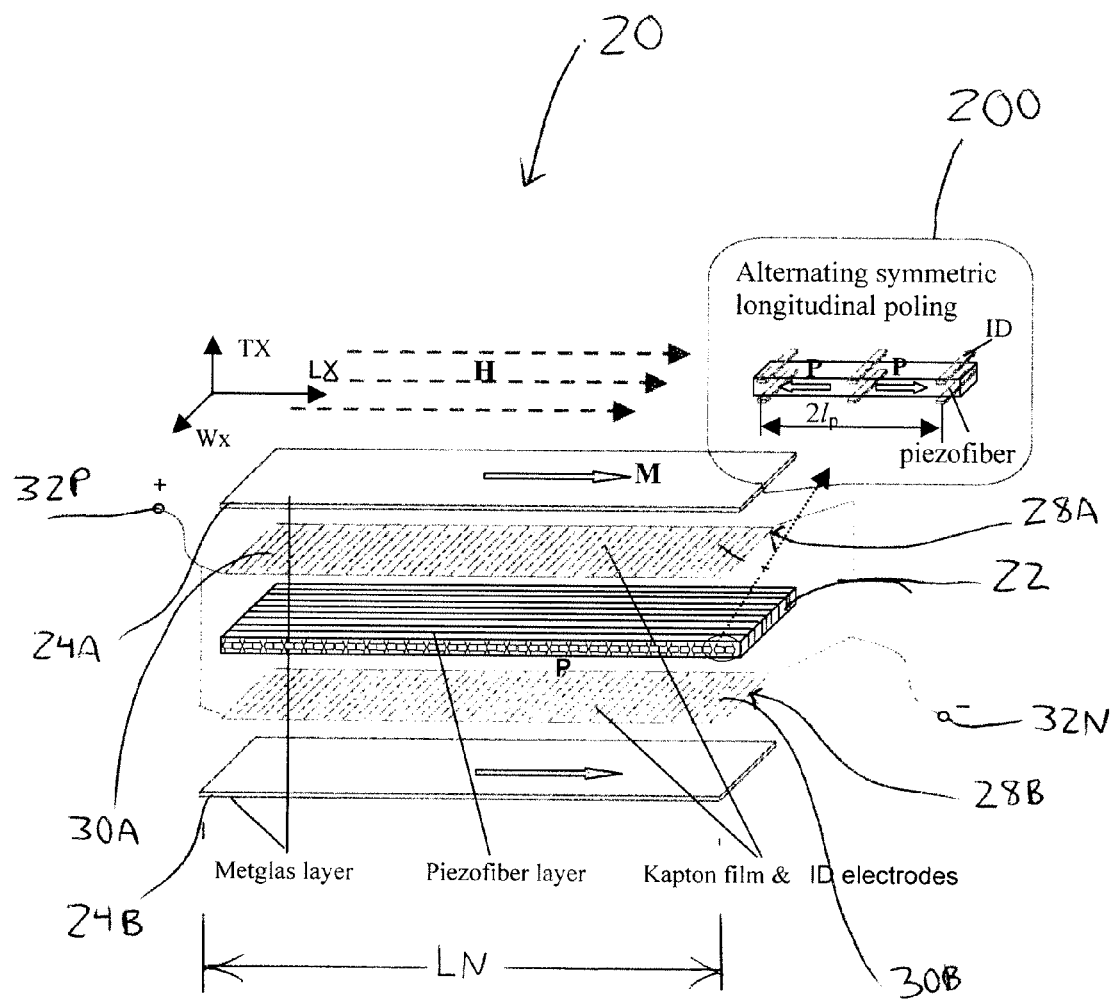
FIG. 2 is an exploded perspective view of one example arrangement according to one (LL) embodiment of the present invention, having high-permeability FeBSiC layers coupled to a (1-3) piezo-fiber layer in an (LL) configuration.

FIG. 2 illustrates one example arrangement 20 of an (L-L) configuration according to the one embodiment, having a piezo-fiber layer 22 laminated between two high-permeability magnetostrictive alloy layers, labeled 24A and 24B. Pursuant to the (L-L) configuration the magnetization axis M of the layers 24A and 24B extends in the same longitudinal direction LX as the piezo-electric fibers forming the piezo-fiber layer 22. The high-permeability magnetostrictive alloy layers 24A and 24B may, for example, be Metglas 2605SA1, available from Metglas, Inc., Conway, S.C.

Referring to FIG. 2, the thickness (not separately labeled) of the high-permeability magnetostrictive alloy layers 24A and 24B is selected and optimized, as understood and readily performed by a person of ordinary skill in the art upon reading this disclosure using well-known computer modeling and simulation methods, based on the intended application and performance characteristic. One illustrative example thickness is approximately 25 microns thickness, having a relative permeability of $\mu_r$>40,000, due to low magneto-crystalline anisotropy, and having a low saturation magnetostriction of $\lambda_s \approx 40$ ppm at $H_{dc}$<10 Oe. The use of a thin-foil form for the high-permeability magnetostrictive layers offers the additional advantage of reducing eddy current losses at high frequencies.

With continuing reference to FIG. 2, the piezo-fiber layer 22 is preferably a (1-3) piezoelectric active fiber/epoxy composite having the piezo-fibers oriented along the longitudinal axis LX of the layer. The fibers may, for example, be PZT-5A ceramic fibers, PMN—PT or PZN—PT single crystal fibers, or equivalent. An illustrative example fiber thickness (not separately numbered) may, for example, be approximately 100 μm and an illustrative example fiber width (not separately numbered) may, for example, be approximately 350 μm. The fibers preferably extend the length of the piezo-fiber layer 22.

With continuing reference to FIG. 2, an upper thin polymer (e.g. Klapton or equivalent) insulating field 28A and lower insulating field and 28B, with inter-digitated (ID) electrodes 30A and 30B, respectively, may be placed between the high-permeability magnetostrictive alloy layers 24A and 24B and the piezo layer 22.

Referring to the exploded view region 200 of FIG. 2, the inter-digitated (ID) electrodes 30A and 30B are preferably formed with respect to the piezo-fibers in the piezo-fiber layer 22 such that each fiber (not separately numbered) has numerous alternating symmetric longitudinally-poled "push-pull" units 34, each formed of a "center" electrode pair (upper and lower) 34A of one polarity surrounded by two "outer" electrode pairs 34B, arranged with a spacing between adjacent like-polarity electrodes in the LX direction. An illustrative example 2 IP dimension is approximately 1 mm. This multiple "push-pull" (L-L) configuration is preferable, as the present inventors observe, without any statement of theoretical conclusion, that likely, this optimizes stress transfer and enhances the dielectric capacitance of the laminate.

With continuing reference to FIG. 2, all of the upper electrodes ID of the inter-digitated electrodes 34A of "positive" polarity are connected together by a rail conductor (not separately numbered) extending in the LX direction, which connects to a "plus" terminal labeled 32P. Likewise, all of the lower electrodes ID of the inter-digitated electrodes 34B of the same "positive" polarity are connected together by a rail conductor (not separately numbered) extending in the LX direction, which connects to the same "positive" terminal labeled 32P. Similarly, all of the upper electrodes ID of the inter-digitated electrodes 34A of "negative" polarity are connected together by a rail conductor (not separately numbered) extending in the LX direction, and all of the lower electrodes ID of the inter-digitated electrodes 34B of "negative "polarity are connected together by a rail conductor (not separately numbered), also extending in the LX direction, both of these rails connecting to a "negative" terminal labeled 32N.

The positive terminal 32P and the negative terminal 32N may connect to an amplifier (not shown), in accordance with conventional ME sensor methods.

The layers 22, 24A, 24B and insulating fields 28A, 28B with inter-digitated (ID) electrodes 30A, 30B may be assembled into the laminate composite 20 using an epoxy resin (not shown).

Samples

One sample was constructed having a (1-3) piezo-fiber layer according to layer 22 approximately 30 mm long between two FeBSiC high-permeability magnetostrictive alloy layers, arranged according to the layers 24A and 24B, each approximately the same 30 mm in length.

A second, longer laminate sample was also constructed by laminating a (1-3) piezo-fiber layer, also having a length of approximately 30 mm between two high-permeability magnetostrictive FeBSiC layers, each approximately 100 mm in length. Following Nenham's composite nomenclature, these ME laminates have a 2-1 connectivity of magnetic-piezoelectric phases.

Figure 3:
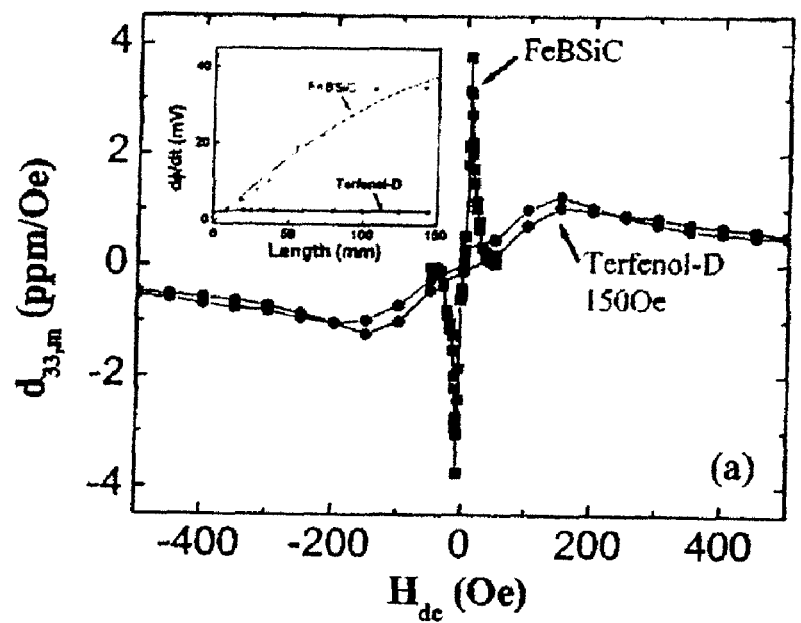
FIG. 3 graphically shows a comparison of effective piezomagnetic coefficients as a function of dc magnetic bias $H_{dc}$, of high-permeability FeBSiC and Terfenol-D alloys.

FIG. 3 shows the effective $d_{33,m}$ as a function of $H_{dc}$ for ferromagnetic FeBSiC and Terfenol-D alloy layers. These values were calculated from the slope of striction-magnetic field ($\in$-H) curves measured using a strain-gauge method. Referring to FIG. 3, it is seen that the maximum value of $d_{33,m}$ is ≠4 ppm/Oe. Although Terfenol-D has much higher magnetostriction λ, its effective $d_{33,m}$ is notably lower than that of the FeBSiC alloy in the embodiments of the present invention. This difference reflects the much higher magnetic permeability of FeBSiC: a high $\mu_r$ results in a low saturation field, and thus a large value of dλ/dH at low $H_{dc}$. In addition, high μ FeBSiC layers also concentrate magnetic flux (δϕ/δt).

With continuing reference to FIG. 3, the inset 300 shows dϕ/dt as a function of the length (l) of the FeBSiC and Terfenol-D layers, measured using a search coil. The present inventors note that the flux in the FeBSiC layer (cross-section area is A=7×0.025 mm$^2$) is much higher (approximately twenty times greater) than that of Terfenol-D (A=6×1.5 mm$^2$); and also that dϕ/dt≠1 for the FeBSiC layer. As will be understood by a person or ordinary skill, this shows the FeBSiC layer arranged as described herein as a superior dc-biased piezomagnetic layer for ME laminate composites, and that can operate under reduced $H_{dc}$.

The voltage induced across the ID electrodes of the piezo fiber layer of the samples was measured as a function of (i) $H_{dc}$ and (ii) as a function of the frequency, $f$, under the following conditions: (i) as a function of $H_{dc}$ in response to a constant ac ($f$=1 kHz) magnetic drive of $H_{ac}$-1 Oe, both applied along the length of the laminate; and (ii) as a function of $f$ under constant $H_{ac}$=1 Oe and $H_{dc}$=4 Oe. In this measurement, an electromagnet was used to apply $H_{dc}$; a pair of Helmholtz coils was used to generate a small $H_{ac}$, and the induced voltage was measured by a lock-in amplifier.

Figure 4A:
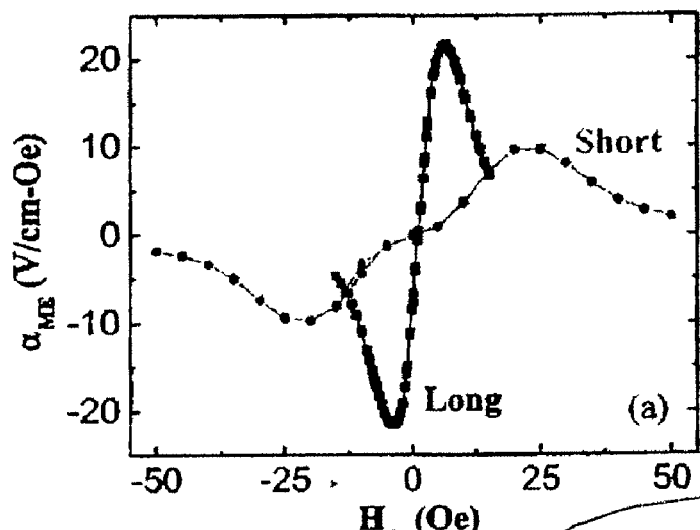
FIGS. 4A-4C graphically show magnetoelectric characterizations of tested sample FeBSiC/piezo-fiber composite laminates according to the present invention, with FIG. 5A showing $\alpha_{ME}^{(L-L)}$ as a function of $H_{dc}$ for two samples, FIG. 5B showing $\alpha_{ME}^{(L-L)}$ as a function of frequency, and FIG. 5C showing anisotropy of $\alpha_{ME}$ for $H_{dc}$ applied along the length ($\alpha_{ME}^{L-L}$), width ($\alpha_{ME}^{T1-L}$), and thickness ($\alpha_{ME}^{T2-L}$) of the laminate.

Referring to FIG. 4A, $\alpha_{ME}^{(L-L)}$ is shown as a function of $H_{dc}$, with data shown for both short (LN=30 mm) and long (LN-100 mm) laminates arranged according to FIG. 2.

With continuing reference to FIG. 4A, present inventors observe, without any statement of theoretical conclusion, that likely at least the following two phenomena are exhibited by ME composite laminates according to the invention:

(i) that ME coupling in FeBSiC/piezofiber laminates is much higher than that in Terfenol-D/monolithic piezoelectric laminates; and (ii) $\alpha_{ME}^{(L-L)}$≠LN due to a magnetic flux concentration effect, as shown in FIG. 3B, which results in stronger magnetic induction in ME laminates.

These data reveal maximum $\alpha_{ME}^{(L-L)}$ values of 10 (short) and 22 V/cm-Oe (long) under Hdc of 20 and 4 Oe, respectively, which corresponds to 1.8×10$^{-7}$ and 4×10$^{-7}$ s/m or C/m$^2$-Oe. These maximum values are colossal compared to the closest performing comparable prior art, that art showing an $\alpha_{ME}^{L-T}$ in the range of approximately 0.5 to 2.2 V/cm-Oe, and an $\alpha_{ME}^{L-L}$ of approximately 0.1 V/cm-Oe, at $H_{dc}$ of 300 Oe, and requires biases approximately ⅟60 of what is required by such art.

These colossal values of $\alpha_{ME}^{L-L}$ approach the theoretical limit for the case of near-ideal MA coupling shown in Eq. (1), as illustrated in FIG. 1.

Figure 4B:
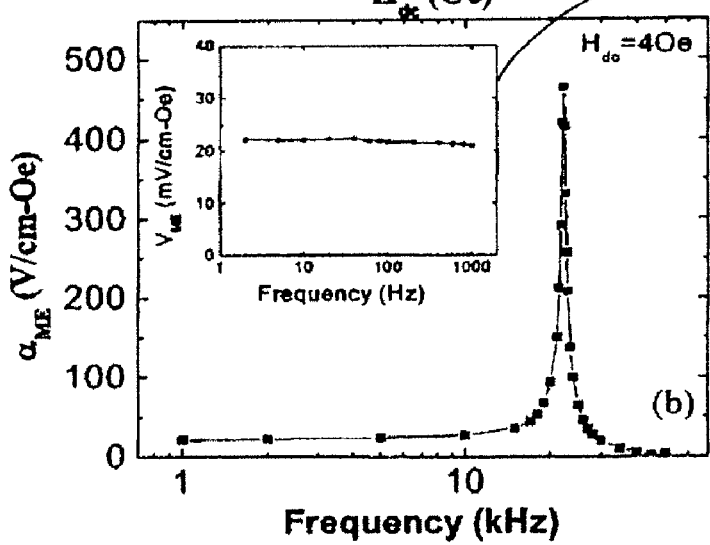

FIG. 4B shows $\alpha_{ME}^{(L-L)}$ for LN=100 mm as a function of frequency under a constant bias of $H_{dc}$=4 Oe. The inset 400 illustrates that colossal values are maintained down to quasi-static frequencies. As FIG. 4B further illustrates, there is a strong resonance enhancement of $\alpha_{ME}^{(L-L)}$ to 500 V/cm-Oe, corresponding to $\alpha_{ME}^{(L-L)}$=10$^{-5}$ s/m, at the frequency of approximately 22 KHz.

Figure 4C:
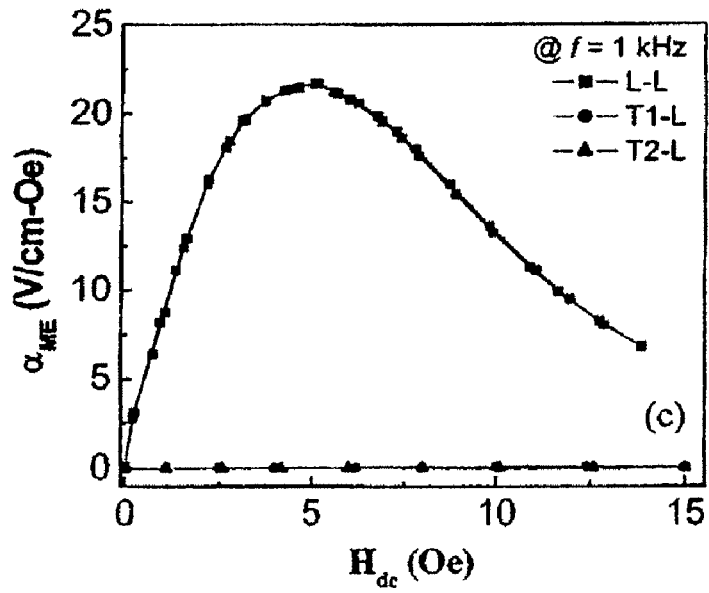

FIG. 4C shows $\alpha_{ME}$-$H_{DC}$ for $H_{ac}$ applied along the length ($\alpha_{ME}^{(L-L)}$), width ($\alpha_{ME}^{(T1-L)}$), and thickness ($\alpha_{ME}^{(T2-L)}$) of the laminate. The data show that $\alpha_{ME}^{(L-L)}$ is dramatically larger than either $\alpha_{ME}^{(T1-L)}$ or $\alpha_{ME}^{(T2-L)}$, with a large anisotropy factor of 100<K=$\alpha_{ME}^{(L-L)}$/$\alpha_{ME}^{(T-L)}$<1000. The present inventors observe, without any statement of theoretical conclusion, that this likely can be attributed to the unidirectional nature, in structures according to the present invention, of the following two characteristics: (i) length-strain sensitivity of piezo-fibers; and (ii) demagnetization factor N of Metglas ribbon.

Figure 5:
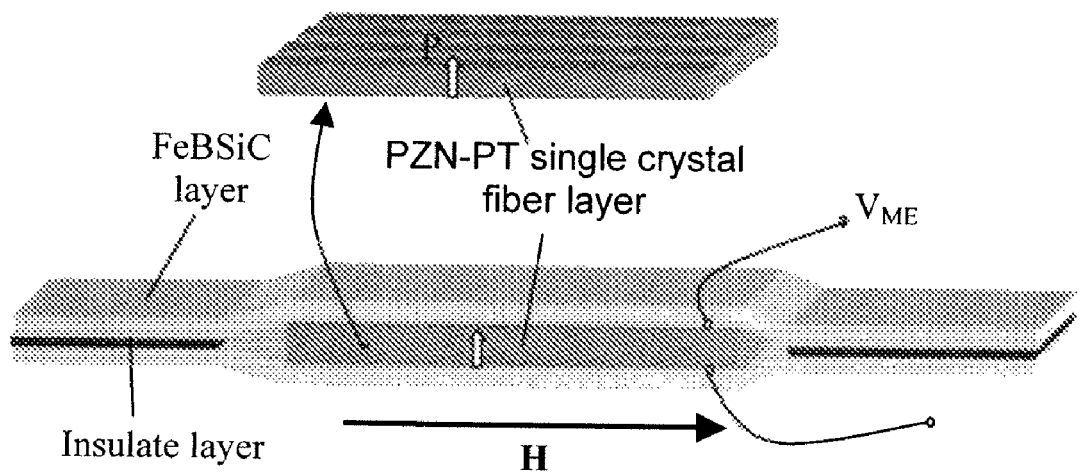
FIG. 5 shows an alternative embodiment, having high-permeability FeBSiC layers coupled to a (1-3) piezo-fiber layer in an (LT) configuration.

FIG. 5 shows an alternative embodiment, comprising of PZN-7%PT (PZNPT) single crystal fibers laminated between two long FeBSiC alloy ribbon layers, operated in a longitudinally (L) magnetized and transversely (T) poled (or L-T) mode. The present inventors have identified this as, compared to all known ME composites that are operated in (L-T) modes, this FIG. 5 FeBSiC/PZN—PT ME configuration has (i) the lowest required dc magnetic bias $H_{dc}$, and (ii) the highest ME voltage and charge coefficients.

Magnetostrictive/piezoelectric laminates operated in an (L-T) mode have been analyzed, showing ME voltage coefficient $V_{ME}^{LT}$ can be given as $$V_{ME}^{LT} = \left| \frac{dE_1}{dH_3} \right| = \frac{n d_{33,m} g_{31,p}}{n s_{11}^E (1 - k_{31,p}^2) + (1-n) s_{33}^H}; \quad (2)$$

where n is the magnetic phase thickness ratio; $d_{33,m}$ and $g_{31,p}$ are the longitudinal piezomagnetic and transverse piezoelectric voltage coefficients, $S_{11}^E$ and $S_{33}^H$ are the elastic compliances of the piezoelectric and magnetostrictive layers; $k_{31,p}$ is the electromechanical coupling coefficient of the piezoelectric layer. Following Eq. (2), the ME charge coupling coefficient for the L-T mode $Q_{ME}^{LT}$ is $$Q_{ME}^{LT} = \frac{dQ_1}{dH_3} = \frac{n d_{33,m} g_{31,p} A_p}{n s_{11}^E (1 - k_{31,p}^2) + (1-n) s_{33}^H}; \quad (3)$$

where $d_{31,p}$ is the transverse piezoelectric charge coefficient and $A_p$ is the electrode area of the piezoelectric fiber layer. Eqs. (2) and (3) shows that a high $d_{33,m}$ in the magnetic phase and a high $g_{31,p}$ or $d_{31,p}$ in the piezoelectric one will result in a high $V_{ME}^{LT}$ or $Q_{ME}^{LT}$.

In Table I, important parameters for Metglas and PZNPT are given. The maximum $d_{33,m}$ of FeBSiC is 3-4 times larger than that of Terfenol-D, and $d_{31,p}$ of PZNPT crystals, approximately 5 times larger than that PZT. Accordingly, much higher values of $V_{ME}^{LT}$ and $Q_{ME}^{LT}$ can be expected for (L-T) FeBSiC/PZNPT-fiber laminates, than for Terfenol-D/PZT ones. Furthermore, the extremely high permeability $\mu_r$=40,000) of FeBSiC alloys will dramatically reduce the saturation field, relative to that of Terfenol-D ($\mu_r$=10): which subsequently will result in a dramatic reduction in the required dc magnetic bias $H_{dc}$. Furthermore, according to Eq. (3), a ME laminate containing more piezoelectric fibers will have a larger $A_p$, resulting in a higher ME charge coefficient $Q_{ME}^{LT}$.

The present inventors chose high-permeability FeBSiC alloy ribbons (Metglas Inc, Conway, S.C.) as the magnetostrictive layers, and PZN-7%PT single crystal fibers poled in a $d_{31}$ configuration (Microfine Materials Tech, Singapore) as the piezoelectric one. A thin PZN—PT crystal plate oriented along [100] in its length direction was cut into fibers of size 15 mm in length, 0.4 mm in width and 0.1 mm in thickness. A piezoelectric fiber layer has a high capacitance in its thickness direction, which is quite thin: therefore, it has potential for achieving high ME charge coupling.

The FeBSiC ribbons were 100 mm long, 5 mm wide, and 25 μm thick. Two FeBSiC alloy ribbons and one PZN—PT single crystal fiber layer were then bonded together using an epoxy resin and heated at 80° C. for 30 minutes, forming a long type ME composite with a two-dimensionally connected magnetic phase and one-dimensionally connected piezoelectric phase, i.e., a (2-1) phase connectivity.

Figure 6:
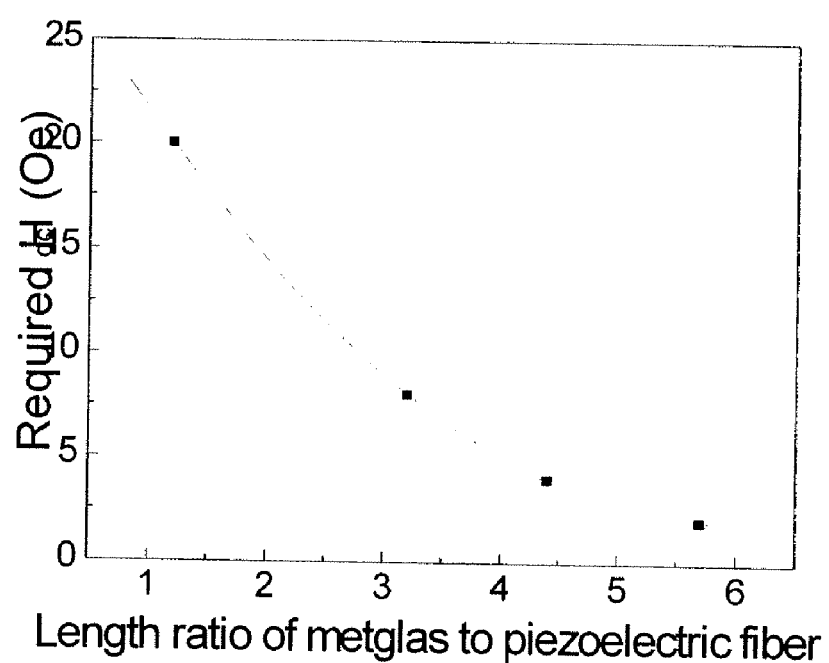
FIG. 6 shows one example of a required $H_{dc}$ as a function of the piezo-electric fiber if the FIG. 5 embodiment.

FIG. 6 illustrates one example FeBSiC/PZNPT-fiber laminate embodiment, having the FeBSiC layer(s) longitudinally magnetized and the piezoelectric layer transversely poled.

During ME measurements, dc ($H_{dc}$) and ac ($H_{ac}$) magnetic fields were applied along the length of the laminates. An electromagnet was used to provide $H_{dc}$, and a Helmholtz coil was used to generate $H_{ac}$=1 Oersted. A lock-in amplifier (SR850) generated a controllable input current to the Helmholtz coil; and was also subsequently used to measure the output voltage induced across the PZN—PT layer of the ME laminate by $H_{ac}$.

The present inventors measured the effect of length of the FeBSiC layer on the required $H_{dc}$ for the ME laminate in FIG. 5. The present inventors identify that, in the prior art, the flux in ME laminates is near linearly increased as the length of the Metglas layer is increased: this is simply because long type high μ layers can collect more magnetic flux. In addition, long magnetic layers in ME laminates are important in lowering the required $H_{dc}$, because it can effectively decrease the demagnetization factor N and reduce the saturation field.

FIG. 6 shows the required $H_{dc}$ as a function of the length ratio of the Metglas layer to that of the piezoelectric fiber one. The results clearly show that longer Metglas layers result in lower required values of $H_{dc}$, until the magnetic phase approaches saturation.

Figure 7A:
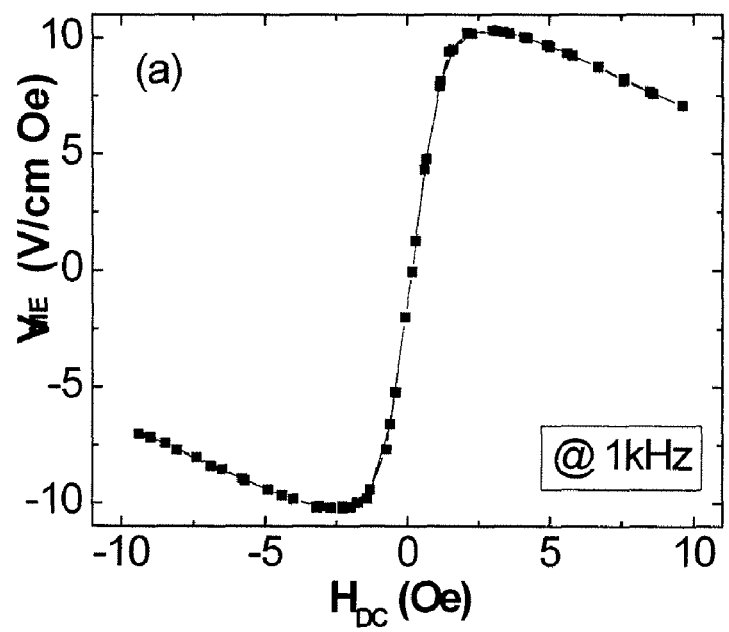
FIGS. 7A and 7B show test results of samples according to the FIG. 5 embodiment, with FIG. 7A showing $V_{ME}^{LT}$ as a function of magnetic bias $H_{dc}$ at $f=1$ kHz, and FIG. 7B showing $V_{ME}^{LT}$ as a function of the ac magnetic drive frequency.

The present inventors measured the ME responses of the FeBSiC/PZN—PT L-T mode laminate of FIG. 5. FIG. 7A shows the low frequency ($f$=1 kHz) ME voltage coefficient as a function of dc magnetic bias $H_{dc}$. The maximum value of this coefficient at sub-resonant frequencies can be seen to be $V_{ME}^{LT}$>10V/cm-Oe under a very low $H_{dc}$=2 Oe: this is approximately 5 times higher than the highest value for a L-T configuration previously reported, which was for Terfenol-D/PMN—PT ($V_{ME}^{LT}$≈2V/cm-Oe[9]) under a $H_{dc}$=500 Oe. The required $H_{dc}$=2 Oe is dramatically lower than that of the prior art.

The present inventors determined that the corresponding maximum value in the ME charge coefficient was $Q_{ME}^{LT}$≈1 nC/Oe.

Figure 7B:
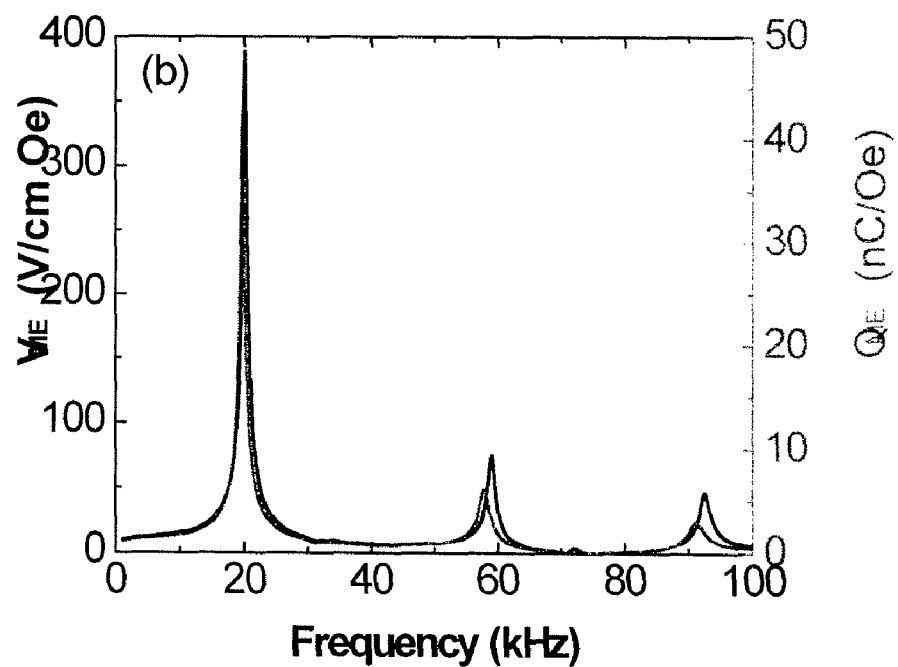

FIG. 7B shows $V_{ME}^{LT}$ of the L-T FeBSiC/PZNPT-fiber laminate as a function of ac magnetic drive frequency at $H_{dc}$=2 Oe. A strong resonance enhancement in $V_{ME}^{LT}$ to 400V/cm-Oe can be seen in this figure at a resonance frequency of $f_1$=20 kHz that corresponds to the first-order longitudinal electromechanical resonance. The corresponding value of $Q_{ME}^{LT}$ was determined to be 42 nC/Oe. This ME laminate also exhibits two small resonances at $f_2$=58 kHz and $f_3$=92 kHz that correspond to second- and third-order longitudinal modes. Such large ME voltage and charge couplings at resonance could be of importance in power device applications.

Referring to Eq. Nos. (2) and (3), the present inventors observe, without any statement of theoretical conclusion, that these large values of the ME coefficients can likely be attributed to: (i) the high apparent piezomagnetic coefficient $d_{33,m}$ of the magnetostrictive FeBSiC alloy phase due to flux concentration, (ii) the high $g_{31,p}$ and $d_{31,p}$ of the PZN—PT single crystal fibers, and (iii) the (2-1) connectivity of the ME laminate configuration that causes a more intimate contact between the two phases.

Further, the present inventors observe, without any statement of theoretical conclusion, that the low value of $H_{dc}$, can be attributed to (i) the high-m of the FeBSiC magnetic layers, (ii) long-type configuration of the ME laminate and (iii) the large compliance of the piezoelectric fibers.

Finally, we also measured the magnetic field sensitivity of L-T FeBSiC/PZNPT-fiber laminates at $f$=1 Hz and 20 kHz. The experimental data (not given) showed that this type of ME laminate had a ME sensitivity of approximately $10^{-11}$ T and $10^{-12}$ T at 1 Hz and resonance, respectively.

In summary, the present inventors identify that the present invention's long-type FeBSiC/PZNPT-fiber laminates operated in a (L-T) mode have large ME voltage and charge coefficients of 10.5V/cm-Oe and 1 nC/Oe respectively at low frequency and under a lowest dc magnetic bias $H_{dc}$=2 Oe, which were dramatically enhanced under resonance drive to 400V/cm-Oe and 42 nC/Oe respectively. On the present inventors' review of the prior art, these values of the ME coefficients obtained by these sample structure according to the invention are approximately five times higher than that previously reported for any L-T laminates.

While certain embodiments and features of the invention have been illustrated and described herein, many modifications, substitutions, changes, and equivalents will occur to those of ordinary skill in the art. It is therefore to be understood that the appended claims are intended to cover all such modifications and changes as fall within the spirit of the invention.

We hereby claim:

1. A high-permeability (L-L) configuration magnetostrictive/piezo-electric composite laminate comprising:
   a (1-3) piezo-fiber layer having piezo-electric fibers extending in a longitudinal direction;
   first and second high-permeability magnetostrictive alloy layers, the (1-3) piezo-fiber layer being laminated between the first and second high-permeability magnetostrictive alloy layers in an (L-L) configuration, wherein the magnetization axis of the first and second magnetostrictive alloy layers extends in the same longitudinal direction as the piezo-electric fibers forming the (1-3) piezo-fiber layer; and
   first and second thin polymer insulating layers, each with inter-digitated (ID) electrodes, placed between respective first and second high-permeability magnetostrictive alloy layers and the (1-3) piezo-fiber layer.

2. The high-permeability (L-L) configuration magnetostrictive/piezo-electric composite laminate of claim 1, wherein the high permeability magnetostrictive layer comprises FeBSiC.

3. The high-permeability (L-L) configuration magnetostrictive/piezo-electric composite of laminate of claim 1, wherein the (1-3) piezo-fiber layer comprises a plurality of PZT ceramic piezo-electric fibers, bound in a resin binder, extending in the longitudinal direction.

4. The high-permeability (L-L) configuration magnetostrictive/piezo-electric composite laminate of claim 1, wherein the plurality of electrodes includes a plurality of longitudinally-poled "push-pull" units, arranged in an alternating symmetric arranged with a given spacing between adjacent like-polarity electrodes in said longitudinal direction.

* * * * *